United States Patent
Lei et al.

(10) Patent No.: US 9,236,305 B2
(45) Date of Patent: Jan. 12, 2016

(54) WAFER DICING WITH ETCH CHAMBER SHIELD RING FOR FILM FRAME WAFER APPLICATIONS

(71) Applicant: Applied Materials, Inc., Santa Clara, CA (US)

(72) Inventors: Wei-Sheng Lei, San Jose, CA (US);
Saravjeet Singh, Santa Clara, CA (US);
Jivko Dinev, Santa Clara, CA (US);
Aparna Iyer, Sunnyvale, CA (US);
Brad Eaton, Menlo Park, CA (US);
Ajay Kumar, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/158,529

(22) Filed: Jan. 17, 2014

(65) Prior Publication Data
US 2014/0213041 A1    Jul. 31, 2014

Related U.S. Application Data

(60) Provisional application No. 61/757,031, filed on Jan. 25, 2013.

(51) Int. Cl.
*H01L 21/302* (2006.01)
*H01L 21/461* (2006.01)
(Continued)

(52) U.S. Cl.
CPC .............. *H01L 21/78* (2013.01); *B23K 26/367* (2013.01); *B23K 26/409* (2013.01); *H01J 37/32009* (2013.01); *H01L 21/0271* (2013.01); *H01L 21/3065* (2013.01); *H01L 21/31105* (2013.01); *H01L 21/31127* (2013.01);
(Continued)

(58) Field of Classification Search
None
See application file for complete search history.

(56) References Cited

U.S. PATENT DOCUMENTS 4,049,944 A    9/1977    Garvin et al.
4,339,528 A    7/1982    Goldman
(Continued)

FOREIGN PATENT DOCUMENTS

JP    9216085    8/1997
JP    10321908    12/1998
(Continued)

OTHER PUBLICATIONS

Linder, V. et al., "Water-Soluble Sacrificial Layers for Surface Micromachining", www.small-journal.com, 2005, 1, No. 7, 7 Pages.
(Continued)

*Primary Examiner* — Calvin Choi
(74) *Attorney, Agent, or Firm* — Blakely Sokoloff Taylor Zafman LLP

(57) ABSTRACT

Laser and plasma etch wafer dicing where a mask is formed covering ICs formed on the wafer, as well as any bumps providing an interface to the ICs. The semiconductor wafer is coupled to a film frame by an adhesive film. The mask is patterned by laser scribing to provide a patterned mask with gaps. The laser scribing exposes regions of the semiconductor wafer, below thin film layers from which the ICs are formed. The semiconductor wafer is plasma etched through the gaps in the patterned mask while the film frame is maintained at an acceptably low temperature with a chamber shield ring configured to sit beyond the wafer edge and cover the frame. The shield ring may be raised and lowered, for example, on lifter pins to facilitate transfer of the wafer on frame.

14 Claims, 7 Drawing Sheets

(51) Int. Cl.
*H01L 21/78* (2006.01)
*H01L 21/3065* (2006.01)
*H01L 21/027* (2006.01)
*H01L 21/311* (2006.01)
*H01J 37/32* (2006.01)
*H01L 21/683* (2006.01)
*B23K 26/36* (2014.01)
*B23K 26/40* (2014.01)

(52) U.S. Cl.
CPC .. *H01L 21/6836* (2013.01); *H01L 2221/68318* (2013.01); *H01L 2221/68327* (2013.01); *H01L 2221/68381* (2013.01)

(56) References Cited

U.S. PATENT DOCUMENTS

| | | | |
|---|---|---|---|
| 4,684,437 A | 8/1987 | Donelon et al. | |
| 5,336,638 A | 8/1994 | Suzuki et al. | |
| 5,593,606 A | 1/1997 | Owen et al. | |
| 5,691,794 A | 11/1997 | Hoshi et al. | |
| 6,051,503 A | 4/2000 | Bhardwaj et al. | |
| 6,057,180 A | 5/2000 | Sun et al. | |
| 6,174,271 B1 | 1/2001 | Kosmowski | |
| 6,300,593 B1 | 10/2001 | Powell | |
| 6,306,731 B1 | 10/2001 | Igarashi et al. | |
| 6,407,363 B2 | 6/2002 | Dunsky et al. | |
| 6,426,275 B1 | 7/2002 | Arisa | |
| 6,465,158 B1 | 10/2002 | Sekiya | |
| 6,528,864 B1 | 3/2003 | Arai | |
| 6,574,250 B2 | 6/2003 | Sun et al. | |
| 6,582,983 B1 | 6/2003 | Runyon et al. | |
| 6,593,542 B2 | 7/2003 | Baird et al. | |
| 6,642,127 B2 | 11/2003 | Kumar et al. | |
| 6,676,878 B2 | 1/2004 | O'Brien et al. | |
| 6,696,669 B2 | 2/2004 | Hembree et al. | |
| 6,706,998 B2 | 3/2004 | Cutler | |
| 6,759,275 B1 | 7/2004 | Lee et al. | |
| 6,803,247 B2 | 10/2004 | Sekiya | |
| 6,887,804 B2 | 5/2005 | Sun et al. | |
| 6,998,571 B2 | 2/2006 | Sekiya et al. | |
| 7,128,806 B2 | 10/2006 | Nguyen et al. | |
| 7,129,150 B2 | 10/2006 | Kawai | |
| 7,179,723 B2 | 2/2007 | Genda et al. | |
| 7,265,033 B2 | 9/2007 | Shigematsu et al. | |
| 7,361,990 B2 | 4/2008 | Lu et al. | |
| 7,364,986 B2 | 4/2008 | Nagai et al. | |
| 7,435,607 B2 | 10/2008 | Nagai | |
| 7,459,377 B2 | 12/2008 | Ueda et al. | |
| 7,468,309 B2 | 12/2008 | Shigematsu et al. | |
| 7,473,866 B2 | 1/2009 | Morishige et al. | |
| 7,507,638 B2 | 3/2009 | Mancini et al. | |
| 7,507,639 B2 | 3/2009 | Nakamura | |
| 7,629,228 B2 | 12/2009 | Haji et al. | |
| 7,678,670 B2 | 3/2010 | Arita et al. | |
| 7,687,740 B2 | 3/2010 | Bruland et al. | |
| 7,754,584 B2 | 7/2010 | Kumakawa | |
| 7,767,551 B2 | 8/2010 | Arita et al. | |
| 7,767,554 B2 | 8/2010 | Arita et al. | |
| 7,776,720 B2 | 8/2010 | Boyle et al. | |
| 7,804,043 B2 | 9/2010 | Deshi | |
| 7,838,323 B2 | 11/2010 | Utsumi et al. | |
| 7,859,084 B2 | 12/2010 | Utsumi et al. | |
| 7,875,898 B2 | 1/2011 | Maeda | |
| 7,906,410 B2 | 3/2011 | Arita et al. | |
| 7,923,351 B2 | 4/2011 | Arita | |
| 7,926,410 B2 | 4/2011 | Bair | |
| 7,927,973 B2 | 4/2011 | Haji et al. | |
| 2003/0162313 A1 | 8/2003 | Kim et al. | |
| 2004/0080045 A1 | 4/2004 | Kimura et al. | |
| 2004/0137700 A1 | 7/2004 | Sekiya | |
| 2004/0157457 A1 | 8/2004 | Xu et al. | |
| 2004/0212047 A1 | 10/2004 | Joshi et al. | |
| 2005/0032332 A1* | 2/2005 | Miyamoto et al. | 438/460 |
| 2006/0043535 A1 | 3/2006 | Hiatt | |
| 2006/0086898 A1 | 4/2006 | Cheng et al. | |
| 2006/0088984 A1 | 4/2006 | Li et al. | |
| 2006/0146910 A1 | 7/2006 | Koochesfahani et al. | |
| 2006/0205182 A1 | 9/2006 | Soejima | |
| 2007/0152691 A1 | 7/2007 | Ogasawara et al. | |
| 2008/0105383 A1 | 5/2008 | Kubo et al. | |
| 2009/0255911 A1 | 10/2009 | Krishnaswami et al. | |
| 2010/0013036 A1 | 1/2010 | Carey | |
| 2010/0216313 A1 | 8/2010 | Iwai et al. | |
| 2010/0248451 A1 | 9/2010 | Pirogovsky et al. | |
| 2011/0014777 A1 | 1/2011 | Haji et al. | |
| 2011/0312157 A1 | 12/2011 | Lei et al. | |
| 2012/0322238 A1* | 12/2012 | Lei et al. | 438/462 |
| 2012/0322239 A1* | 12/2012 | Singh et al. | 438/462 |
| 2013/0045554 A1 | 2/2013 | Yamazaki | |
| 2013/0065378 A1 | 3/2013 | Johnson et al. | |
| 2013/0230972 A1 | 9/2013 | Johnson et al. | |

FOREIGN PATENT DOCUMENTS

| | | |
|---|---|---|
| JP | 2001127011 | 5/2001 |
| JP | 2001144126 | 5/2001 |
| JP | 2003179005 | 6/2003 |
| JP | 2004031526 | 1/2004 |
| JP | 2004055684 | 2/2004 |
| KR | 10-2011-0031885 | 3/2011 |
| WO | WO-03036712 | 5/2003 |
| WO | WO-03071591 | 5/2003 |

OTHER PUBLICATIONS

Singh, Saravjeet et al., "Apparatus and Methods for Dry Etch With Edge, Side and Back Protection", U.S. Appl. No. 61/491,693, filed May 31, 2011 24 pgs.
International Search Report and Written Opinion from PCT/US14/12590 mailed May 20, 2014, 13 pages.

* cited by examiner

WAFER DICING WITH ETCH CHAMBER SHIELD RING FOR FILM FRAME WAFER APPLICATIONS

PRIORITY

This application is a Non-Provisional of, claims priority to, and incorporates by reference in its entirety for all purposes, the U.S. Provisional Patent Application No. 61/757,031 filed Jan. 25, 2013.

TECHNICAL FIELD

Embodiments of the present invention pertain to the field of semiconductor processing and, in particular, to methods of dicing semiconductor wafers, each wafer having a plurality of integrated circuits thereon.

DESCRIPTION OF RELATED ART

In semiconductor wafer processing, integrated circuits are formed on a wafer (also referred to as a substrate) composed of silicon or other semiconductor material. In general, layers of various materials which are either semiconducting, conducting, or insulating are utilized to form the integrated circuits. These materials are deposited and etched using various well-known processes to form integrated circuits. Each wafer is processed to form a large number of individual regions containing integrated circuits known as dice.

Following the integrated circuit formation process, the wafer is "diced" to separate the individual die from one another for packaging or for use in an unpackaged form within larger circuits. The two main techniques that are used for wafer dicing are scribing and sawing. With scribing, a diamond tipped scribe is moved across the wafer surface along pre-formed scribe lines. These scribe lines extend along the spaces between the dice. These spaces are commonly referred to as "streets." The diamond scribe forms shallow scratches in the wafer surface along the streets. Upon the application of pressure, such as with a roller, the wafer separates along the scribe lines. The breaks in the wafer follow the crystal lattice structure of the wafer substrate. Scribing can be used for wafers that are about 10 mils (thousandths of an inch) or less in thickness. For thicker wafers, sawing is presently the preferred method for dicing.

With sawing, a diamond tipped saw rotating at high revolutions per minute contacts the wafer surface and saws the wafer along the streets. The wafer is mounted on a supporting member such as an adhesive film stretched across a film frame and the saw is repeatedly applied to both the vertical and horizontal streets. One problem with either scribing or sawing is that chips and gouges can form along the severed edges of the dice. In addition, cracks can form and propagate from the edges of the dice into the substrate and render the integrated circuit inoperative. Chipping and cracking are particularly a problem with scribing because only one side of a square or rectangular die can be scribed in the direction of the crystalline structure. Consequently, cleaving of the other side of the die results in a jagged separation line. Because of chipping and cracking, additional spacing is required between the dice on the wafer to prevent damage to the integrated circuits, e.g., the chips and cracks are maintained at a distance from the actual integrated circuits. As a result of the spacing requirements, not as many dice can be formed on a standard sized wafer and wafer real estate that could otherwise be used for circuitry is wasted. The use of a saw exacerbates the waste of real estate on a semiconductor wafer. The blade of the saw is approximately 15 microns thick. As such, to insure that cracking and other damage surrounding the cut made by the saw does not harm the integrated circuits, three hundred to five hundred microns often must separate the circuitry of each of the dice. Furthermore, after cutting, each die requires substantial cleaning to remove particles and other contaminants that result from the sawing process.

Plasma dicing has also been used, but may have limitations as well. For example, one limitation hampering implementation of plasma dicing may be cost. A standard lithography operation for patterning resist may render implementation cost prohibitive. Another limitation possibly hampering implementation of plasma dicing is that plasma processing of commonly encountered metals (e.g., copper) in dicing along streets can create production issues or throughput limits.

SUMMARY

Methods, apparatuses, and systems for dicing a semiconductor wafer or substrate including a plurality of integrated circuits (ICs) are described herein.

In one embodiment, a method of dicing a semiconductor wafer including a plurality of integrated circuits involves coupling the semiconductor wafer to a film frame and forming a mask above the semiconductor wafer. The mask covers and protects the integrated circuits. The method involves patterning the mask with a laser scribing process to provide a patterned mask with gaps, exposing regions of the semiconductor wafer between the integrated circuits. The method involves transferring the semiconductor wafer coupled to the film frame to a plasma etch chamber, and covering the film frame with a chamber shield ring without covering any portion of the semiconductor wafer with the chamber shield ring. The method further involves plasma etching the semiconductor wafer through the gaps in the patterned mask to form singulated integrated circuits while the semiconductor wafer is coupled to the film frame.

According to one embodiment, a method of dicing a substrate including a plurality of integrated circuits (ICs) involves coupling the substrate to a film frame and forming a mask over the substrate covering and protecting the ICs. The method involves patterning the mask with a laser scribing process to provide a patterned mask with gaps, exposing regions of the substrate between the ICs. The method involves ablating, with the laser scribing process, the entire thickness of the substrate within the gaps in the patterned mask to singulate the ICs. The method involves transferring the substrate coupled to the film frame to a plasma etch chamber, and covering the film frame with a chamber shield ring without covering any portion of the substrate with the chamber shield ring. The method further involves plasma etching substrate surfaces exposed by the laser scribing process.

In one embodiment, a method of dicing a semiconductor wafer including a plurality of integrated circuits involves coupling the semiconductor wafer to a film frame and forming a mask above the semiconductor wafer. The mask covers and protects the integrated circuits. The method involves disposing the semiconductor wafer over a temperature controlled chuck surface of a plasma chamber and disposing the film frame over a top surface of a temperature controlled annular ring disposed around the temperature controlled chuck surface. The method involves covering the film frame with a chamber shield ring without covering any portion of the semiconductor wafer with the chamber shield ring. The method further involves plasma etching the semiconductor wafer while the semiconductor wafer is coupled to the film frame.

In one embodiment, a system for dicing a semiconductor wafer including a plurality of integrated circuits (ICs) includes a laser scribe module to pattern a mask disposed above the semiconductor wafer to form a trench exposing regions of the semiconductor wafer between the ICs. The system also includes a plasma etch chamber coupled to the laser scribe module to plasma etch the semiconductor wafer through the gaps in the patterned mask to form singulated ICs. The plasma etch chamber includes a temperature controlled chuck to support the semiconductor wafer while being coupled to a film frame during an etching process, and a chamber shield ring configured to cover the film frame without covering any portion of the semiconductor wafer.

BRIEF DESCRIPTION OF THE DRAWINGS

Embodiments of the present invention are illustrated by way of example, and not limitation, in the figures of the accompanying drawings in which.

DETAILED DESCRIPTION

Figure 1:
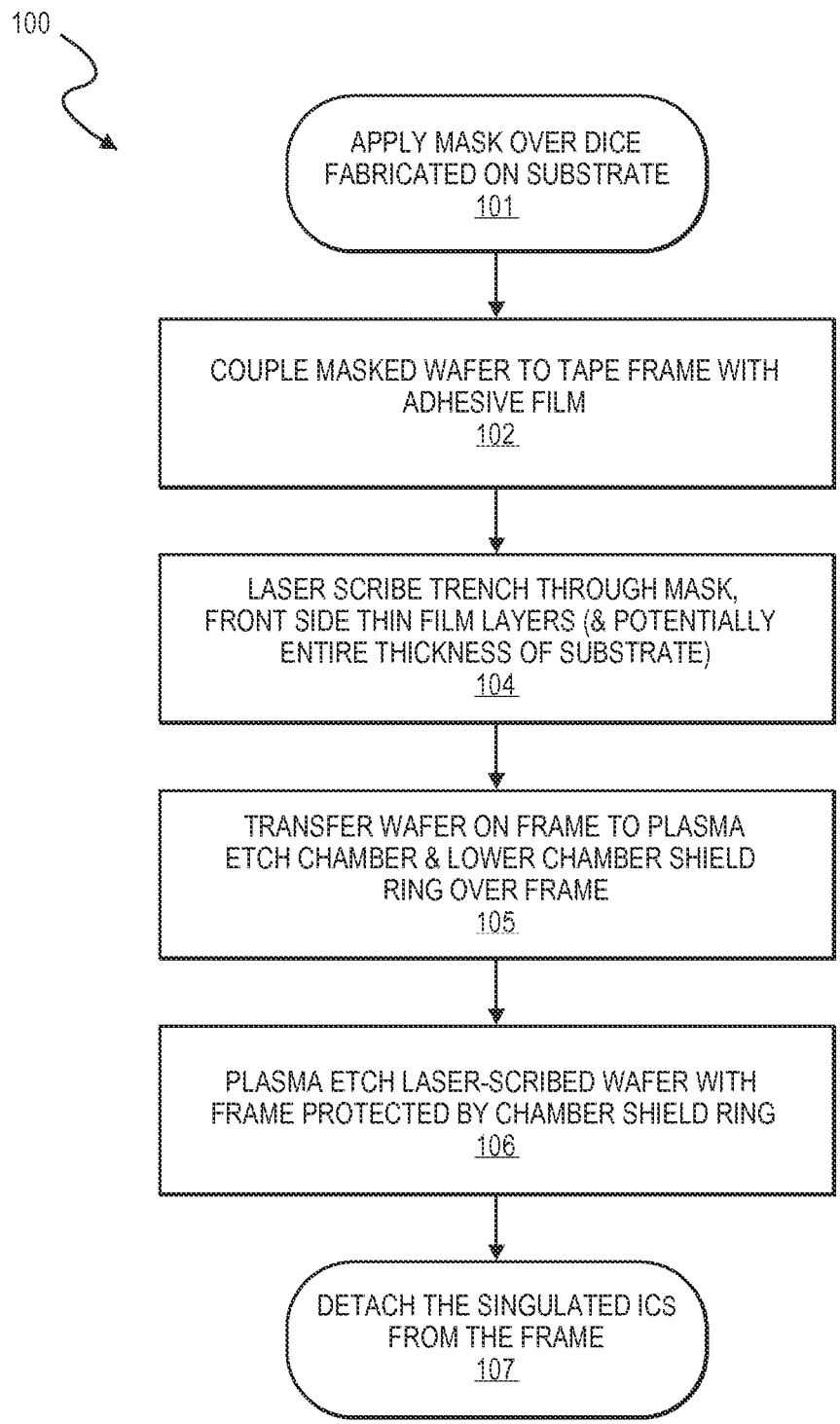
FIG. 1 is a flowchart representing operations in a method of dicing a semiconductor wafer including a plurality of integrated circuits, in accordance with an embodiment of the present invention.

Methods of dicing semiconductor wafers, each wafer having a plurality of integrated circuits thereon, are described. In the following description, numerous specific details are set forth, such as laser and plasma etch wafer dicing approaches with temperature control hardware and techniques, in order to provide a thorough understanding of embodiments of the present invention. It will be apparent to one skilled in the art that embodiments of the present invention may be practiced without these specific details. In other instances, well-known aspects, such as integrated circuit fabrication, are not described in detail in order to not unnecessarily obscure embodiments of the present invention. Furthermore, it is to be understood that the various embodiments shown in the Figures are illustrative representations and are not necessarily drawn to scale.

A hybrid wafer or substrate dicing process involving an initial laser scribe and subsequent plasma etch may be implemented for die singulation. The laser scribe process may be used to cleanly remove a mask layer, organic and inorganic dielectric layers, and device layers. The laser scribe process may then be terminated upon exposure of the wafer or substrate semiconductor, or after ablating through an entire thickness of the semicondutor substrate. The plasma etch portion of the dicing process may then be employed to etch either through the remaining bulk thickness of the semiconductor substrate, such as through bulk single crystalline silicon to singulate the chips/dice, or employed to removed semiconductor damaged by the laser ablation to improve die strength.

In a hybrid wafer or substrate dicing process a wafer to be diced is generally mounted on a tape film frame with an adhesive film (e.g., UV-release dicing tape). The tape film frame may be of a type amenable to conventional pick-and-place equipment and also amenable to robotic handling and clamping inside a plasma etch chamber during the hybrid dicing process. Typically, the film frame is of a metal, such as stainless steel, that has been stamped to form an annulas.

In an embodiment, a semiconductor wafer mounted on the frame is etched in a plasma etch chamber that includes a dielectric shield ring dimensioned to cover the tape film frame during a plasma etching of the substrate. It has been found that during such plasma etching, the frame, when covered by the shield ring, is less subject to heating by the high density etch plasma. Because the coefficients of thermal expansion of the frame and substrate may differ significantly, maintaining the frame at a lower temperature advantageously reduces stress in the substrate during the etch process. Furthermore, where the substrate semiconductor is relatively thick (e.g., greater than 100 µm), plasma heating of the film frame has been found to elevate the frame temperature to 130° C., or more. At such high temperatures, the tape film (e.g., polymeric materials and organic adhesives) evaporate causing adhesive failures. These high temperatures also cause most mask materials to cross-link, or otherwise decompose and evaporate, resulting in contaminants prone to redeposit into the device structures and etched features disposed on the wafer. In the presence of the shield ring however, the maximum temperature of the frame, even for long plasma etch times associated with thick wafer, has been found not to exceed 100° C., which is safely below the critical temperature of many mask materials and tape films employed for mounting the substrate to the frame.

In an embodiment, a chamber shield ring is dimensioned to be annular with a smaller inner diameter (I.D.) than that of the tape film frame, but larger than the outer diameter (O.D.) of the substrate, to completely cover the frame. The shield ring I.D. is advantageously larger than the substrate O.D. so as to avoid masking any portion of the etch and/or contact any portion of the wafer even when slightly misaligned within the etch chamber and/or with respect to the frame center.

In an embodiment, a plasma etch chamber is configured to include a chamber shield ring. The chamber shield ring may be moveably affixed to a chuck upon which the wafer and frame are disposed upon during the etching process. In an embodiment, the chamber shield ring is disposed on a plurality of lifter pins which raise and lower the shield ring to allow passage of the wafer-on-frame during robotic material transfer and to allow the shield ring to be disposed sufficiently close to the frame during processing that a plasma is not maintained between the shield ring and the frame.

In an embodiment, a suitable wafer thickness for the above approach is anywhere from 25 microns (μm), to 800 μm, or thicker. For IC memory chips, as memory capacity increases, multichip functions and continuous packaging miniaturization may require ultra thin wafer dicing. For logic device chips/processors, major challenges lie in IC performance increases and the adoption of low-k and other materials. Wafer thicknesses in the range of approximately 100 microns to 760 microns are used for such applications to ensure sufficient chip integrity. Processor chip designers/fabricators may place test element groups (TEGs or test patterns) as well as alignment patterns in wafer streets. A kerf width approximately in the range of 50 microns to 100 microns, at least at the top surface of the wafer, may thus be needed to separate adjacent chips and remove only the test patterns. A major focus is to achieve delamination-free and efficient dicing processes.

Embodiments described herein may address dicing applications of IC wafers, especially with processor chips that have a thickness approximately in the range of 100 microns to 500 microns, and more particularly approximately in the range of 100 microns to 600 microns thickness, and an acceptable dicing kerf width approximately in the range of 50 microns to 200 microns, and more particularly approximately in the range of 50 microns to 100 microns, measured on wafer front surface (e.g., corresponding typical kerf width measured from the back side of the wafer is approximately 30-50 microns in a laser/saw hybrid process). One or more embodiments are directed to a hybrid laser scribing plus plasma etching approach to dice wafers as described above.

Figure 2A:
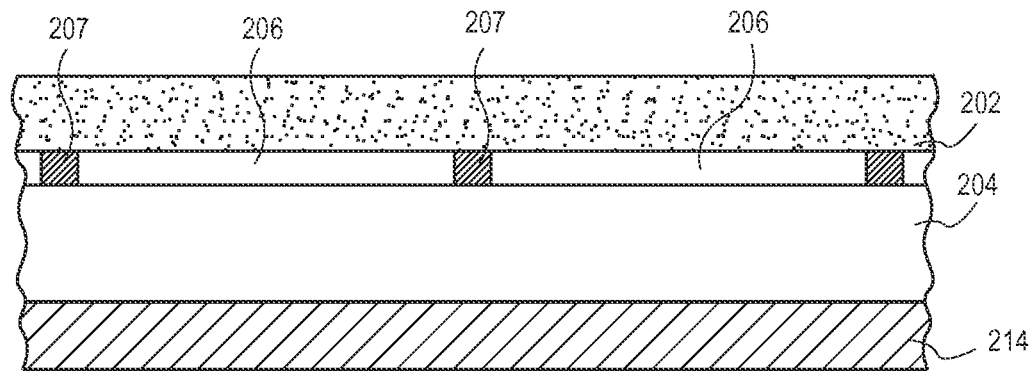
FIG. 2A illustrates a cross-sectional view of a semiconductor wafer including a plurality of integrated circuits during performance of a method of dicing the semiconductor wafer, corresponding to operation 101 of FIG. 1, in accordance with embodiments of the present invention.
Figure 2B:
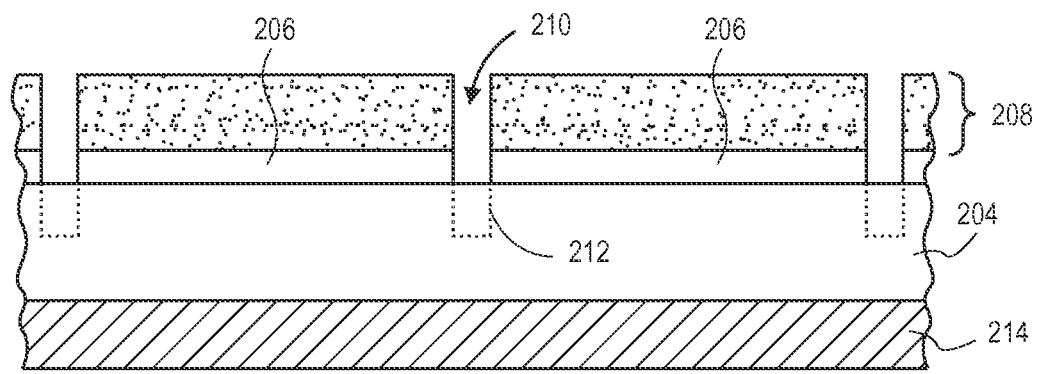
FIG. 2B illustrates a cross-sectional view of a semiconductor wafer including a plurality of integrated circuits during performance of a method of dicing the semiconductor wafer, corresponding to operation 104 of FIG. 1, in accordance with embodiments of the present invention.
Figure 2C:
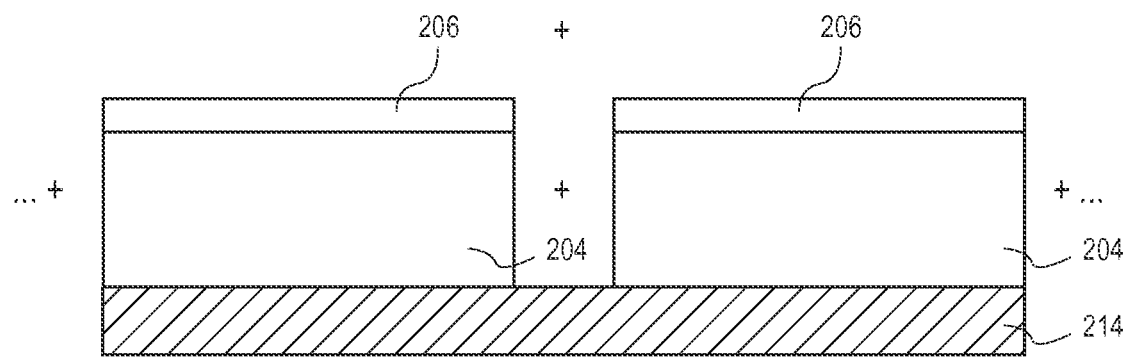
FIG. 2C illustrates a cross-sectional view of a semiconductor wafer including a plurality of integrated circuits during performance of a method of dicing the semiconductor wafer, corresponding to operation 106 of FIG. 1, in accordance with embodiments of the present invention.

FIG. 1 illustrates operations in a method 100 of dicing a semiconductor wafer including a plurality of integrated circuits, in accordance with an embodiment of the present invention. FIGS. 2A-2C illustrate cross-sectional views of a semiconductor wafer including a plurality of integrated circuits during performance of the method 100 while FIGS. 4A-4E illustrate cross-sectional views of attachment and detachment of the semiconductor wafer to a tape film frame and covering of the frame during plasma etching as the method 100 is performed.

Figure 4A:
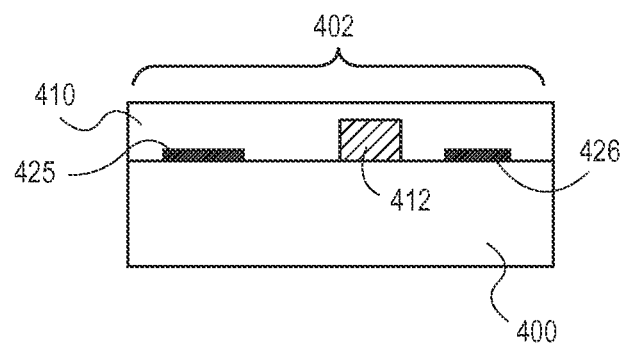
FIGS. 4A, 4B, 4C, 4D, and 4E illustrate cross-sectional views of various operations in a method of dicing a semiconductor wafer, in accordance with embodiments of the present invention.

Referring to operation 101 of method 100, and to corresponding FIG. 2A, a mask 202 is formed above a semiconductor wafer or substrate 204. The wafer or substrate 204 is disposed on an adhesive film 214 having an adhesive disposed on at least one side of the carrier film. The adhesive film 214 is further disposed on a film frame (not shown in FIGS. 2A-2C), as described in greater detail in association with FIGS. 4A-4E. As is shown in FIG. 4A, a mask 410, which may be any of the materials described for mask 202 is disposed on an active side 402 of a semiconductor wafer 400, e.g., by spin coating a resist or other material. Although illustrated in FIG. 4A as a non-conformal, planarized mask (e.g., the thickness of the mask 410 over a bump is less than thickness of the mask 410 in a valley), in an alternate embodiment, the mask 410 is a conformal mask. Conformal mask embodiments advantageously ensure sufficient thickness of the mask 410 over topography (e.g., 20 μm bumps) to survive the duration of a plasma etch dicing operation. Formation of a conformal mask may be by CVD, for example, or by any other process known in the art.

Depending on the thickness of the material properties of the semiconductor wafer 400, the mask 410 may be applied before or after attaching the wafer 400 to a film frame. In the exemplary embodiment illustrated in FIG. 1A and FIG. 4A, the mask is applied prior to attaching the semiconductor wafer 400 to a film frame. In certain such embodiments, the wafer 400 has a thickness greater than 50 μm, and is between 100 and 150 μm in highly advantageous embodiments. In alternative embodiments, the mask 410 is applied subsequent to attaching the semiconductor wafer 400 to a film frame. In certain such embodiments, the wafer 400 has a thickness less than 500 μm.

As shown in FIG. 2A, the mask 202 covers and protects integrated circuits (ICs) 206 formed on the surface of semiconductor wafer 204 and also protects bumps projecting or protruding up 10-20 μm from the surface of the semiconductor wafer 204. The mask 202 also covers intervening streets 207 formed between adjacent ones of the integrated circuits 206.

In accordance with an embodiment of the present invention, forming the masks 202 and 410 includes forming a layer such as, but not limited to, a photo-resist layer or an I-line patterning layer, or a water soluble layer. For example, a polymer layer such as a photo-resist layer may be composed of a material otherwise suitable for use in a lithographic process. In one embodiment, the photo-resist layer is composed of a positive photo-resist material such as, but not limited to, a 248 nanometer (nm) resist, a 193 nm resist, a 157 nm resist, an extreme ultra-violet (EUV) resist, or a phenolic resin matrix with a sensitizer. In another embodiment, the photo-resist layer is composed of a negative photo-resist material.

In water soluble embodiments a water soluble layer is only a first (bottom) layer of a multi-layered mask stack, or the only layer of the mask. Unlike other more conventional masking materials such as photoresist, inorganic dielectric hardmasks such as silicon dioxide, or silsesquioxanes, a mask including the water soluble layer may be readily removed without damage to the underlying passivation layer and/or bump. Where the water soluble layer is the mask, the water soluble layer is more than a mere contamination protection layer utilized during a conventional scribing process and is instead to provide protection during the subsequent plasma etching of the streets. As such, in one embodiment, the water soluble layer is to be of sufficient thickness to survive the subsequent plasma etch process, protecting even the bump which, being copper, may be damaged, oxidized, or otherwise contaminated if exposed to an etchant plasma. In another embodiment, the bump may be exposed during plasma etching. The minimum thickness of the water soluble layer is a function of the selectivity achieved by the subsequent plasma etch (e.g., operation 106 in FIG. 1). The plasma etch selectivity is dependent on at least both the material/composition of the water soluble layer and the etch process employed. Generally, where the plasma utilized has relatively low ion bombardment energy, etch selectivity over the mask material is improved, allowing for a thinner water soluble layer.

In an embodiment, the water soluble material includes a water soluble polymer. Many such polymers are commercially available for applications such as laundry and shopping bags, green packaging, etc. However, selection of water soluble material for the present invention is complicated by stringent demands on maximum film thickness, etch resistance, thermal stability, mechanics of applying and removing the material from the substrate, and microcontamination. In the street, the maximum thickness $T_{max}$ of the water soluble layer is limited by the ability of a laser to pattern through the masking by ablation. The water soluble layer may be much thicker over the ICs 425, 426 (FIG. 4A) and or edges of the street (207 in FIG. 2A) where no street pattern is to be formed. As such, $T_{max}$ is generally a function of the optical conversion efficiency associated with laser wavelength. As $T_{max}$ is associated with the street feature topography, street width, and the method of applying the water soluble layer may be selected to achieve a desired $T_{max}$. In particular embodiments, the water soluble layer has a thickness $T_{max}$ which is less than 20 μm and advantageously less than 10 μm with a thicker mask calling for multiple laser passes.

In an embodiment, the water soluble layer is thermally stable to at least 60° C., preferably stable at 100° C., and ideally stable to 120° C. to avoid excessive crosslinking during the subsequent plasma etch process when the material's temperature may be elevated (e.g., to improve chemical etch rate of substrate semiconductor). Generally, excessive crosslinking adversely affects the solubility of the material, making post-etch removal of the mask layer more difficult. Depending on the embodiment, the water soluble layer 202, 410 may be either wet applied over the substrate to cover an IC passivation layer and bump (e.g., 412 in FIG. 4A), or applied as a dry film laminate. For either mode of application, exemplary materials include, at least one of: poly(vinyl alcohol), poly(acrylic acid), poly(methacrylic acid), poly(acrylamide), or poly(ethylene oxide) with many other water soluble materials also readily available, particularly as a dry film laminate. Dry films for lamination may include the water soluble material only or may further include an adhesive layer that may also be water soluble or not. In a particular embodiment, the dry film includes a UV sensitive adhesive layer which has reduced adhesive bond strength upon UV exposure. Such UV exposure may occur during the subsequent plasma street etch.

Experimentally, poly(vinyl alcohol) (PVA) has been found to have an etch rate of between 1 μm/min and 1.5 μm/min for an exemplary anisotropic silicon plasma etch process (e.g., approximately 1:20 PVA: silicon), and an even lower etch rate for conditions improving the isotropic character of the plasma etch. The other exemplary materials may offer similar etch performance. As such, the minimum thickness over a top bump surface of an IC may be determined by the required plasma etch, which is a function of the thickness of the laser scribe depth, as well as thickness of the scribe damage layer, as measured from the ablation sidewall. In the exemplary embodiment where a femtosecond laser is employed, the water soluble layer has a minimum thickness of less than 10 μm, and advantageously less than 5 μm, which provides sufficient margin for removing at least 1-3 μm of the substrate with a plasma etch process to remove ablation damage. Additional mask thickness may be provided where the plasma etch is employed to singulate a thicker substrate.

In an embodiment, semiconductor wafer or substrates 204 (FIGS. 2A-2C) and 400 (FIG. 4A-4E) are of a material suitable to withstand a fabrication process and upon which semiconductor processing layers may suitably be disposed. For example, in one embodiment, semiconductor wafer or substrate 204 is composed of a group IV-based material such as, but not limited to, crystalline silicon, germanium or silicon/germanium. In a specific embodiment, providing the semiconductor wafer 204 includes providing a monocrystalline silicon substrate. In a particular embodiment, the monocrystalline silicon substrate is doped with impurity atoms. In another embodiment, the semiconductor wafer or substrate 204 is composed of a III-V material or III-N such as, e.g., GaN used in the fabrication of light emitting diodes (LEDs).

Referring to FIG. 2A, the semiconductor wafer or substrate 204 has disposed thereon or therein, as a portion of the integrated circuits 206, an array of semiconductor devices. Examples of such semiconductor devices include, but are not limited to, memory devices or complimentary metal-oxide-semiconductor (CMOS) transistors fabricated in a silicon substrate and encased in a dielectric layer. A plurality of metal interconnects may be formed above the devices or transistors, and in surrounding dielectric layers, and may be used to electrically couple the devices or transistors to form the integrated circuits 206. Conductive bumps and passivation layers may be formed above the interconnect layers. Materials making up the streets 207 may be similar to or the same as those materials used to form the integrated circuits 206. For example, streets 207 may be composed of layers of dielectric materials, semiconductor materials, and metallization. In one embodiment, one or more of the streets 207 includes test devices similar to the actual devices of the integrated circuits 206.

Returning to FIG. 1, the method 100 proceeds with coupling a semiconductor wafer to a film frame with an adhesive film at operation 102. In an embodiment, a UV-curable adhesive film 214 in FIGS. 2A-2C and a UV-curable adhesive film 406 in FIGS. 4A-4H is a dicing tape including a carrier film disposed under at least a first adhesive layer (a second adhesive layer may be present on an opposite side of the carrier film for double-sided embodiments). In an embodiment, the adhesive is composed of a material, or materials, with an adhesive property that weakens (i.e., releases) upon exposure to UV light. In one such embodiment, the carrier film is composed of polyvinyl chloride and the one or two adhesive layers are acrylic-based adhesive layers.

Figure 4B:
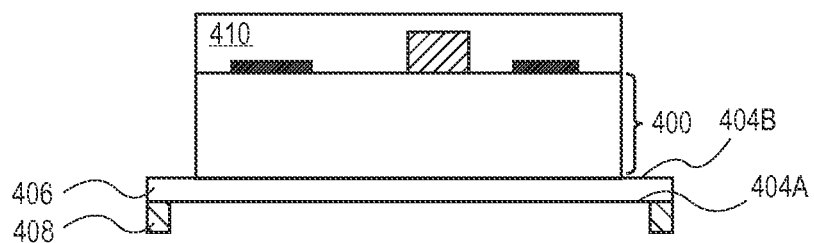

In one embodiment, as shown in FIG. 4B, coupling the wafer to the adhesive film entails contacting one adhesive layer 404A to the film frame 408. In the embodiment illustrated, the UV-cureable adhesive film is applied, for example with a conventional wafer tape applicator, first to the film frame 408 and then a second adhesive side 404B is contacted to the semiconductor wafer 400 (FIG. 4B). Because the film frame 408 is larger than the wafer (e.g., ~380 mm for a 300 mm diameter wafer), the wafer 400 may be aligned to the taped film frame 408 before contacting the exposed adhesive. In an alternative embodiment, the UV-cureable adhesive film is applied, for example with a conventional wafer tape applicator, first to the semiconductor wafer 400, before contacting a second adhesive side to the film frame 408. For such embodiments, a first side of the double-side UV-curable tape is applied to the wafer backside (opposite front side 402), the taped wafer is then aligned with an untaped film frame and brought into contact with the film frame.

Figure 4C:
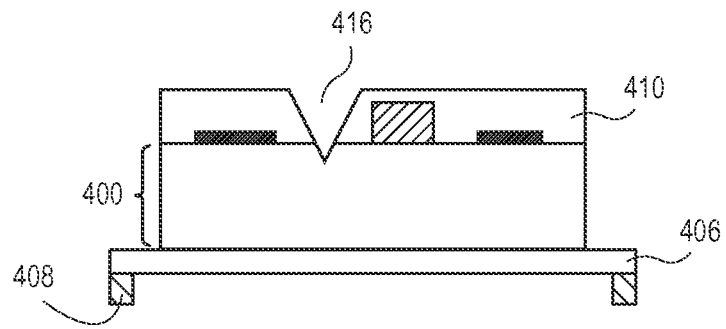

As shown in FIG. 4C, with the adhesive film 406 applied to a side of the film frame 408 by way of the adhesive 404A, the semiconductor wafer 400 is affixed to the other adhesive layer 404B with the mask 410 exposed. Although it is advantageous to apply the adhesive to the carrier substrate first where the semiconductor wafer 400 is very fragile, in alternate embodiments the double-sided adhesive film 406 (e.g., adhesive layer 404B) may also be applied to the wafer 400 first and then the other side of the adhesive film (e.g., adhesive layer 404A) applied to the film frame 408.

Figure 4D:
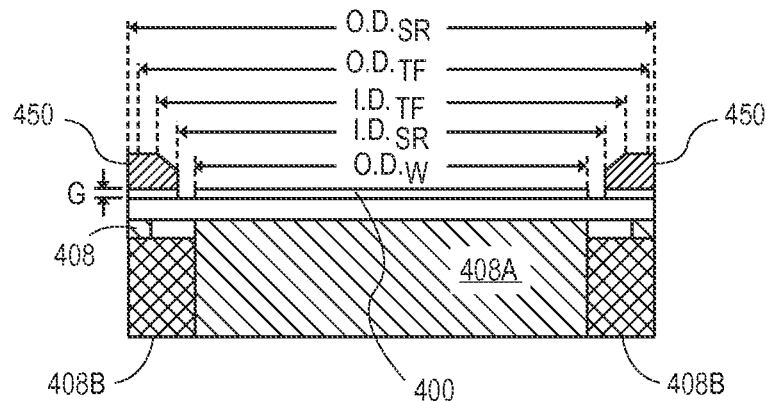
Figure 4E:
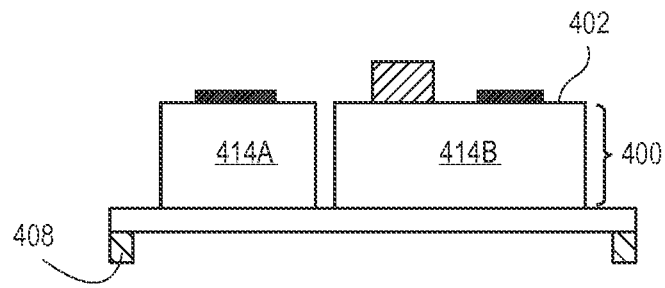

Returning to FIG. 1, with the semiconductor wafer mounted onto the carrier, method 100 proceeds to laser scribing operation 104. FIG. 2B provides a near field cross-sectional view of the mask 202 being patterned with a laser scribing process to provide a patterned mask 208 with gaps 210, exposing regions of the semiconductor wafer or substrate 204 between the integrated circuits 206. FIG. 4D provides a far field cross-sectional view of the laser scribe process forming the gaps 412 while the wafer 400 is affixed to the film frame 408 by adhesive film 406.

Referring to FIG. 2B, the laser scribing process is generally to remove the material of the streets 207 present between the integrated circuits 206. In accordance with an embodiment of the present invention, patterning the mask 202 with the laser scribing process includes forming trenches 212 partially into the regions of the semiconductor wafer 204 between the integrated circuits 206. In an embodiment, patterning the mask 202 with the laser scribing process includes using a laser having a pulse width in the femtosecond range. Specifically, a laser with a wavelength in the visible spectrum or the ultra-violet (UV) or infra-red (IR) ranges (the three totaling a broadband optical spectrum) may be used to provide a femtosecond-based laser, i.e., a laser with a pulse width on the order of the femtosecond ($10^{-15}$ seconds). In one embodiment, ablation is not, or is essentially not, wavelength dependent and is thus suitable for complex films such as films of the mask 202, the streets 207 and, possibly, a portion of the semiconductor wafer or substrate 204.

Laser parameters selection, such as pulse width, may be critical to developing a successful laser scribing and dicing process that minimizes chipping, microcracks, and delamination in order to achieve clean laser scribe cuts. The cleaner the laser scribe cut, the smoother an etch process that may be performed for ultimate die singulation. In semiconductor device wafers, many functional layers of different material types (e.g., conductors, insulators, semiconductors) and thicknesses are typically disposed thereon. Such materials may include, but are not limited to, organic materials such as polymers, metals, or inorganic dielectrics such as silicon dioxide and silicon nitride.

Figure 3:
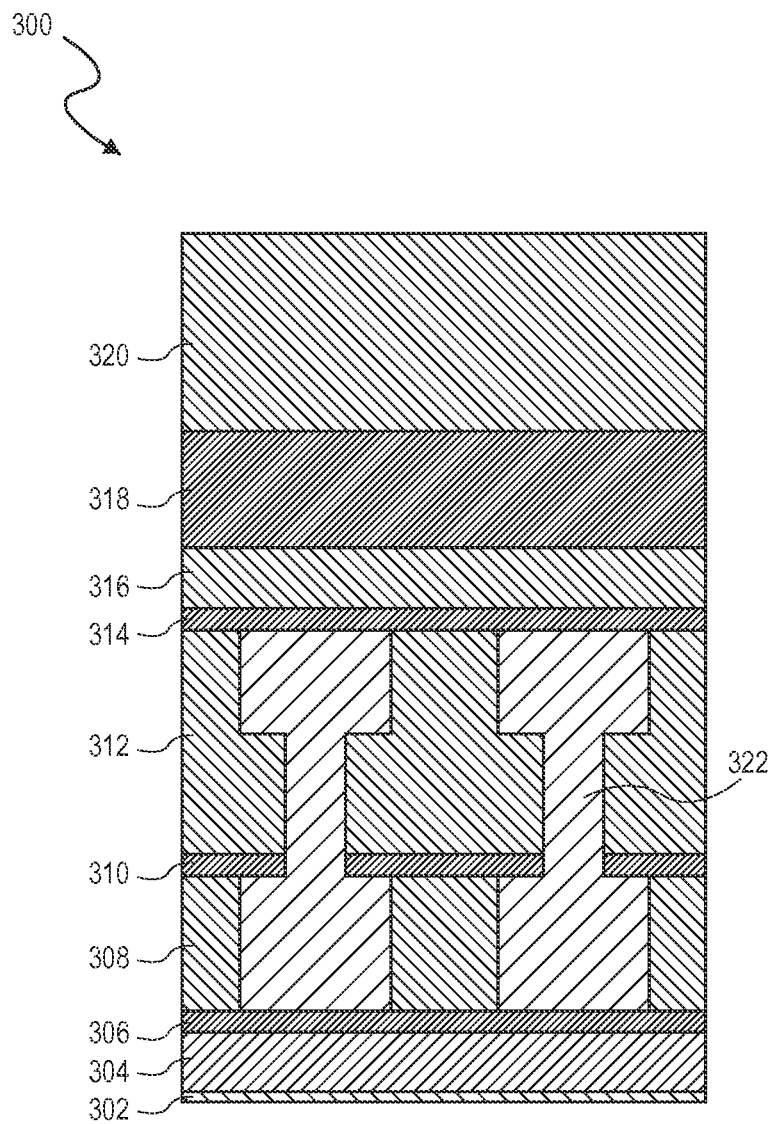
FIG. 3 illustrates a cross-sectional view of a stack of materials that may be present in a street region of a semiconductor wafer or substrate, in accordance with embodiments of the present invention.

A street between individual integrated circuits disposed on a wafer or substrate may include the similar or same layers as the integrated circuits themselves. For example, FIG. 3 illustrates a cross-sectional view of a stack of materials that may be used in a street region of a semiconductor wafer or substrate, in accordance with an embodiment of the present invention. Referring to FIG. 3, a street region 300 includes the top portion 302 of a silicon substrate, a first silicon dioxide layer 304, a first etch stop layer 306, a first low K dielectric layer 308 (e.g., having a dielectric constant of less than the dielectric constant of 4.0 for silicon dioxide), a second etch stop layer 310, a second low K dielectric layer 312, a third etch stop layer 314, an undoped silica glass (USG) layer 316, a second silicon dioxide layer 318, and a layer of photo-resist 320, with relative thicknesses depicted. Copper metallization 322 is disposed between the first and third etch stop layers 306 and 314 and through the second etch stop layer 310. In a specific embodiment, the first, second and third etch stop layers 306, 310 and 314 are composed of silicon nitride, while low K dielectric layers 308 and 312 are composed of a carbon-doped silicon oxide material.

Under conventional laser irradiation (such as nanosecond-based or picosecond-based laser irradiation), the materials of street 300 may behave quite differently in terms of optical absorption and ablation mechanisms. For example, dielectrics layers such as silicon dioxide, is essentially transparent to all commercially available laser wavelengths under normal conditions. By contrast, metals, organics (e.g., low K materials) and silicon can couple photons very easily, particularly in response to nanosecond-based or picosecond-based laser irradiation. In an embodiment, however, a femtosecond-based laser process is used to pattern a layer of silicon dioxide, a layer of low K material, and a layer of copper by ablating the layer of silicon dioxide prior to ablating the layer of low K material and the layer of copper. In a specific embodiment, pulses of approximately less than or equal to 400 femtoseconds are used in a femtosecond-based laser irradiation process to remove a mask, a street, and a portion of a silicon substrate.

In accordance with an embodiment of the present invention, suitable femtosecond-based laser processes are characterized by a high peak intensity (irradiance) that usually leads to nonlinear interactions in various materials. In one such embodiment, the femtosecond laser sources have a pulse width approximately in the range of 10 femtoseconds to 500 femtoseconds, although preferably in the range of 100 femtoseconds to 400 femtoseconds. In one embodiment, the femtosecond laser sources have a wavelength approximately in the range of 1570 nanometers to 200 nanometers, although preferably in the range of 540 nanometers to 250 nanometers. In one embodiment, the laser and corresponding optical system provide a focal spot at the work surface approximately in the range of 3 microns to 15 microns, though preferably approximately in the range of 5 microns to 10 microns.

The spacial beam profile at the work surface may be a single mode (Gaussian) or have a shaped top-hat profile. In an embodiment, the laser source has a pulse repetition rate approximately in the range of 200 kHz to 10 MHz, although preferably approximately in the range of 500 kHz to 5 MHz. In an embodiment, the laser source delivers pulse energy at the work surface approximately in the range of 0.5 µJ to 100 µJ, although preferably approximately in the range of 1 µJ to 5 µJ. In an embodiment, the laser scribing process runs along a work piece surface at a speed approximately in the range of 500 mm/sec to 5 m/sec, although preferably approximately in the range of 600 mm/sec to 2 m/sec.

The scribing process may be run in single pass only, or in multiple passes, but, in an embodiment, in preferably only 1-2 passes. In one embodiment, the scribing depth in the work piece is approximately in the range of 5 microns to 50 microns deep, preferably approximately in the range of 10 microns to 20 microns deep. The laser may be applied either in a train of single pulses at a given pulse repetition rate or a train of pulse bursts. In an embodiment, the kerf width of the laser beam generated is approximately in the range of 2 microns to 15 microns, although in silicon wafer scribing/dicing preferably approximately in the range of 6 microns to 10 microns, measured at the device/silicon interface.

Laser parameters may be selected with benefits and advantages such as providing sufficiently high laser intensity to achieve ionization of inorganic dielectrics (e.g., silicon dioxide) and to minimize delamination and chipping caused by underlayer damage prior to direct ablation of inorganic dielectrics. Also, parameters may be selected to provide meaningful process throughput for industrial applications with precisely controlled ablation width (e.g., kerf width) and depth. As described above, a femtosecond-based laser is far more suitable to providing such advantages, as compared with picosecond-based and nanosecond-based laser ablation processes. However, even in the spectrum of femtosecond-based laser ablation, certain wavelengths may provide better performance than others. For example, in one embodiment, a femtosecond-based laser process having a wavelength closer to or in the UV range provides a cleaner ablation process than a femtosecond-based laser process having a wavelength closer to or in the IR range. In a specific such embodiment, a femtosecond-based laser process suitable for semiconductor wafer or substrate scribing is based on a laser having a wavelength of approximately less than or equal to 540 nanometers. In a particular such embodiment, pulses of approximately less than or equal to 400 femtoseconds of the laser having the wavelength of approximately less than or equal to 540 nanometers are used. However, in an alternative embodiment, dual laser wavelengths (e.g., a combination of an IR laser and a UV laser) are used.

Figure 6:
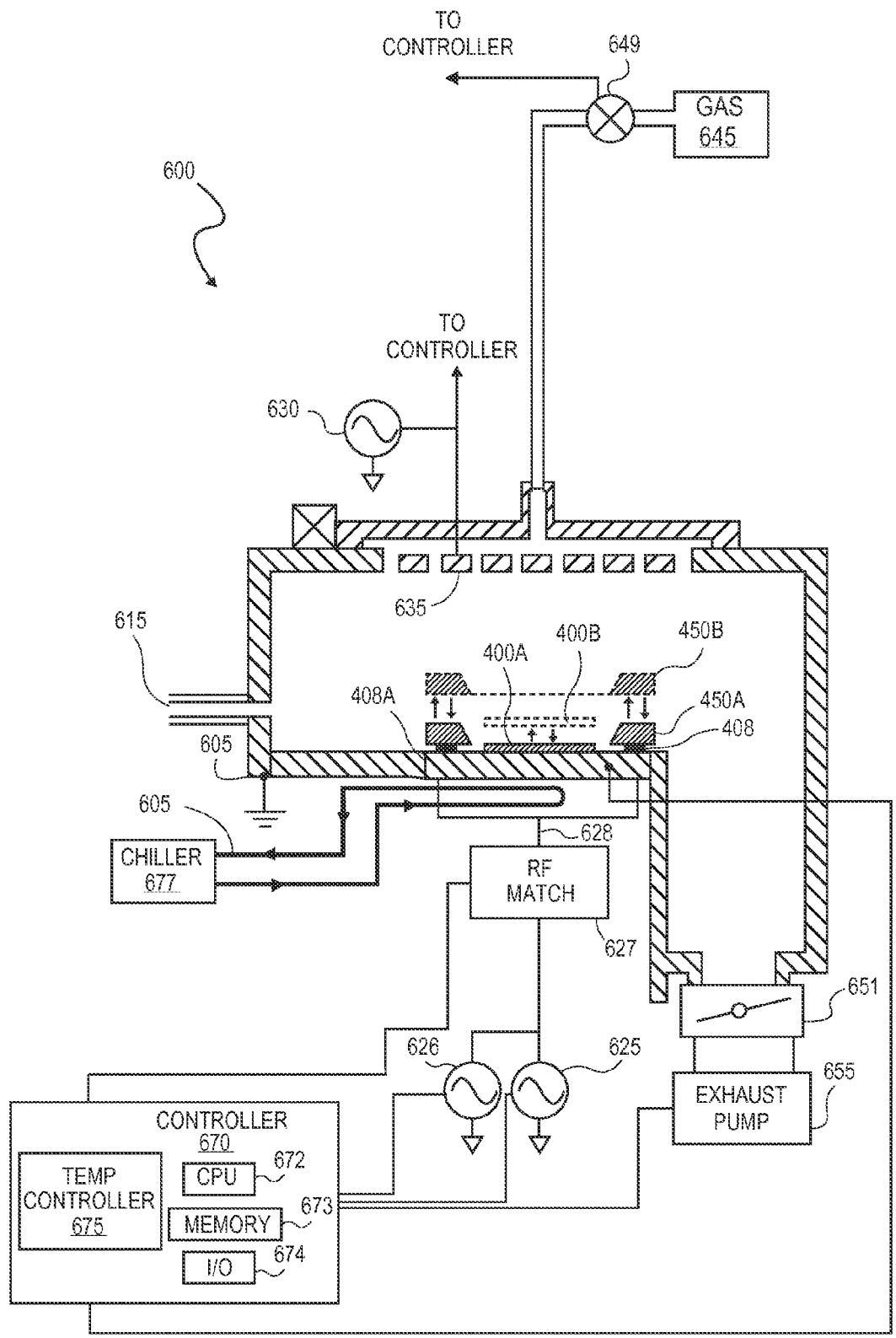
FIG. 6 illustrates a schematic of an etch chamber including a chamber shield ring, in accordance with an embodiment.

Proceeding with the method 100, the wafer-on-frame assembly is transferred from the laser scribe module to a plasma etch module including a plasma etch chamber, for example as illustrated in FIG. 6. At operation 105, at least the wafer is disposed on a top surface of a temperature controlled (chilled) chuck. In exemplary embodiments, the temperature controlled chuck surface is cooled to less than 0° C. As illustrated in FIG. 4D, when loaded in the etch chamber for the plasma etch process, the wafer 400 is disposed on a chuck 408A while attached to the film frame by the adhesive film. In one embodiment, the film frame 408 is of a diameter larger than the chuck 408A and therefore rests on an outer annular ring 408B surrounding the chuck 408A. Cooling of the film frame 408 is therefore through thermal conduction through the annular ring 408B to the chuck 408A, or directly to the annular ring 408B where the annular ring 408B is also temperature controlled. In an alternative embodiment, the temperature controlled chuck 408A is large enough to further support both the wafer 400 and the film frame 408. For example, where a the wafer 400 is a 300 mm wafer and the film frame has an outer diameter of 380-400 mm, the chuck may have an outer diameter of 400 mm, or more (e.g., 450-460 mm).

As further illustrated in FIG. 4D, following transfer of the wafer on film frame into the chamber, a shield ring 450 is disposed proximate to the frame 408. In embodiments, the shield ring 450 is a dielectric material, such as any ceramic conventional to etch chamber hardware (e.g., yttria, alumina, etc.). In embodiments, the shield ring 450 is dimensioned and centered with the chuck 408A so as to cover substantially all of the frame 408 and protect all portions of the frame from plasma exposure. In the exemplary embodiment, the shield ring 450 is annular in shape with an $I.D._{SR}$ greater than an outer diameter of the wafer ($O.D._W$). For example, in one embodiment with a 300 mm substrate, the I.D. of the shield ring is 305-375 mm. In this manner, the shield ring 450 does not mask any portion of the substrate 400 during the etch process. The shield ring 450 will generally cover a portion of the tape 406 spanning a distance between the O.D. of substrate 400 ($O.D._W$) and the I.D. of the frame 408 ($I.D._{TF}$). In further embodiments, the shield ring 450 has an outer diameter ($O.D._{SR}$) greater than the O.D. of the frame ($O.D._{TF}$). Although there are many frame configurations with a standard yet to be established, exemplary frames have an O.D. of 380-385 mm. For such embodiments therefore, the shield ring 450 has an O.D. of at least 380 mm and advantageously greater than 385 mm (e.g., 400 mm).

In the exemplary embodiment, the shield ring is affixed to the plasma etch chamber by a set of lifter pins configured to raise and lower the shield ring between an elevated position and a lowered position. In the elevated position, the shield ring 450 allows passage of the substrate 400 on the film frame 408 between the shield ring 450 and the chuck 408A. In the lowered position, the shield ring 450 is no more than 5 mm above a top surface of the film frame 408 (or above a top surface of the tape 406 disposed over the film frame 408). In the lowered position, the shield ring 450 is advantageously not in direct contact with the film frame 408 (or the top surface of the tape 406 disposed over the film frame 408), but is in sufficient proximity so as to ensure no plasma is formed between the shield ring 450 and the frame 408 (e.g., within a Debye length for the plasma conditions). In exemplary embodiments, there is at least a 1 mm, but no more than a 5 mm, gap between the shield ring, when lowered, and the top surface of the frame 408 (or overlying tape 406). Lifter pins, for example embedded within the ring 408B may raise and lower the shield ring 450 between the elevated (transfer) and lowered (process) positions.

With the shield ring in position (e.g., lowered), the method 100 continues with the plasma etch operation 106 where the semiconductor wafer is plasma etched, either to singulate the ICs where the scribe did not pass through the entire thickness of the wafer (e.g., semiconductor substrate thicknesses above 50-75 μm), and/or to remove thermally damaged semiconductor found along the ablation paths. As illustrated in FIG. 2C, the plasma etch front proceeds through the gaps 210 in the patterned mask 208 to form singulated integrated circuits 206. In accordance with an embodiment of the present invention, etching the semiconductor wafer includes etching the trenches formed with the laser scribing process to ultimately etch entirely through semiconductor wafer. This is illustrated both in FIG. 2C for the substrate 204 and in FIG. 4E for the wafer 400. In the exemplary embodiments illustrated by FIGS. 2C and 4E, the plasma etching is stopped on the adhesive film 214, 406, respectively with individualized portions 414 (e.g., 414A and 414B) of the semiconductor wafer 400 separated by trench 416.

In a specific embodiment, during the etch process the etch rate of the material of semiconductor wafer 204 is greater than 25 microns per minute. An ultra-high-density plasma source may be used for the plasma etching portion of the die singulation process. An example of a process chamber suitable to perform such a plasma etch process is the Applied Centura® Silvia™ Etch system available from Applied Materials of Sunnyvale, Calif., USA. The Applied Centura® Silvia™ Etch system combines the capacitive and inductive RF coupling, which gives much more independent control of the ion density and ion energy than is possible with capacitive coupling only, even with the improvements provided by magnetic enhancement. This combination enables effective decoupling of the ion density from ion energy, so as to achieve relatively high density plasmas without the high, potentially damaging, DC bias levels, even at very low pressures. Multi-RF source configurations also results in an exceptionally wide process window. However, any plasma etch chamber capable of etching silicon may be used, at least in theory, for example, if throughput is not of paramount importance.

In an exemplary embodiment, a deep silicon etch is used to etch a single crystalline silicon substrate or wafer 204 at an etch rate greater than approximately 40% of conventional silicon etch rates (e.g., 40 μm, or more) while maintaining essentially precise profile control and virtually scallop-free sidewalls. In a specific embodiment, a through-silicon via type etch process is used. The etch process is based on a plasma generated from a reactive gas, which generally is a fluorine-based gas such as $NF_3$, $SF_6$, $SiF_4$, $C_4F_8$, $CHF_3$, $XeF_2$, or any other reactant gas capable of etching silicon at a relatively fast etch rate.

In further embodiments, the plasma etch operation 106 removes a thickness of semiconductor from the sidewalls of the scribed trenches. The singulated dies need sufficiently high die break strengths to ensure reliable die pick and place and subsequent assembly processes. It has been found that the rough, damaged sidewalls present following the laser ablation operation 104 unacceptably reduce die break strength. However, it has also been found that the damage layer in a silicon substrate for a femtosecond laser is less than 3 μm thick and that a higher die break strength can be achieved by performing the plasma etch operation 106 to remove a comparable thickness of semiconductor from sidewalls exposed by the trench 212.

Vertical etch rates of 10 μm/min are expected with lateral etch rate being between 50 and 100% of that, depending on process conditions. As such, etch time is generally within 10 to 90 sec, depending on the desired undercut and/or remaining thickness of the substrate. In embodiments, the wafer temperature during the plasma etch operation 106 is elevated to at least 50° C., and advantageously between 70° C. and 80°

C. for a least a portion of the plasma etch process for highest chemical etch rate, although it is advantageous to maintain the mask layer at a temperature below 100° C. to prevent extensive crosslinking in the mask material and subsequent difficulty in mask removal. At temperatures below 100° C., water solubility of the mask is advantageously maintained.

In embodiments, particularly those where the etch operation 106 singulates the substrate 400, it has been found advantageous to reduce backside coolant gas (e.g., He) pressure to less than 20 mTorr, and more advantageously less than 5 mT, during at least a portion of the plasma etch. While the amount of gas supplied through the surface of the chuck 408A to the backside of the substrate 400 is minimal at such pressures, higher backside pressure has been found to induce severe bowing of the wafer, particularly just before the etch front passes through the final portion of the wafer thickness (e.g., last 50 µm). Such bowing can lead to catastrophic breakage of one or more die and is therefore to be avoided. In embodiments, the entire plasma etch operation is performed at a backside He pressure of less than 20 mT, while in other embodiments, backside He pressures are reduced between etch recipe steps with increasing etch duration (e.g., ramped down over time) so as to permit best cooling between the chuck 408A and the substrate 400 permissible for a given remaining minimum substrate thickness. The patterned mask 410 is then removed after the laser scribe and plasma etch portions of the singulation process and before removal of the adhesive film 406.

Following the plasma etch operation 106, the singulated integrated circuits remain coupled to the adhesive film. A package assembly house may thereby utilize the film frame 408 much as they would any tape frame in a conventional pick and place packaging process at operation 107. In one such embodiment, detachment of die is on an individual die-basis with a conventional pick-n-place machine. Alternatively, a protective layer, such as a conventional protective dicing tape may be applied to the side opposite the adhesive film 406, for example as would be done to a side of the semiconductor prior to dicing in conventional dicing tape/tape frame application.

A single process tool may be configured to perform many or all of the operations in a hybrid laser ablation and plasma etch singulation process. For example, FIG. 5 illustrates a block diagram of a tool layout for laser and plasma dicing of wafers or substrates, in accordance with an embodiment of the present invention.

Figure 5:
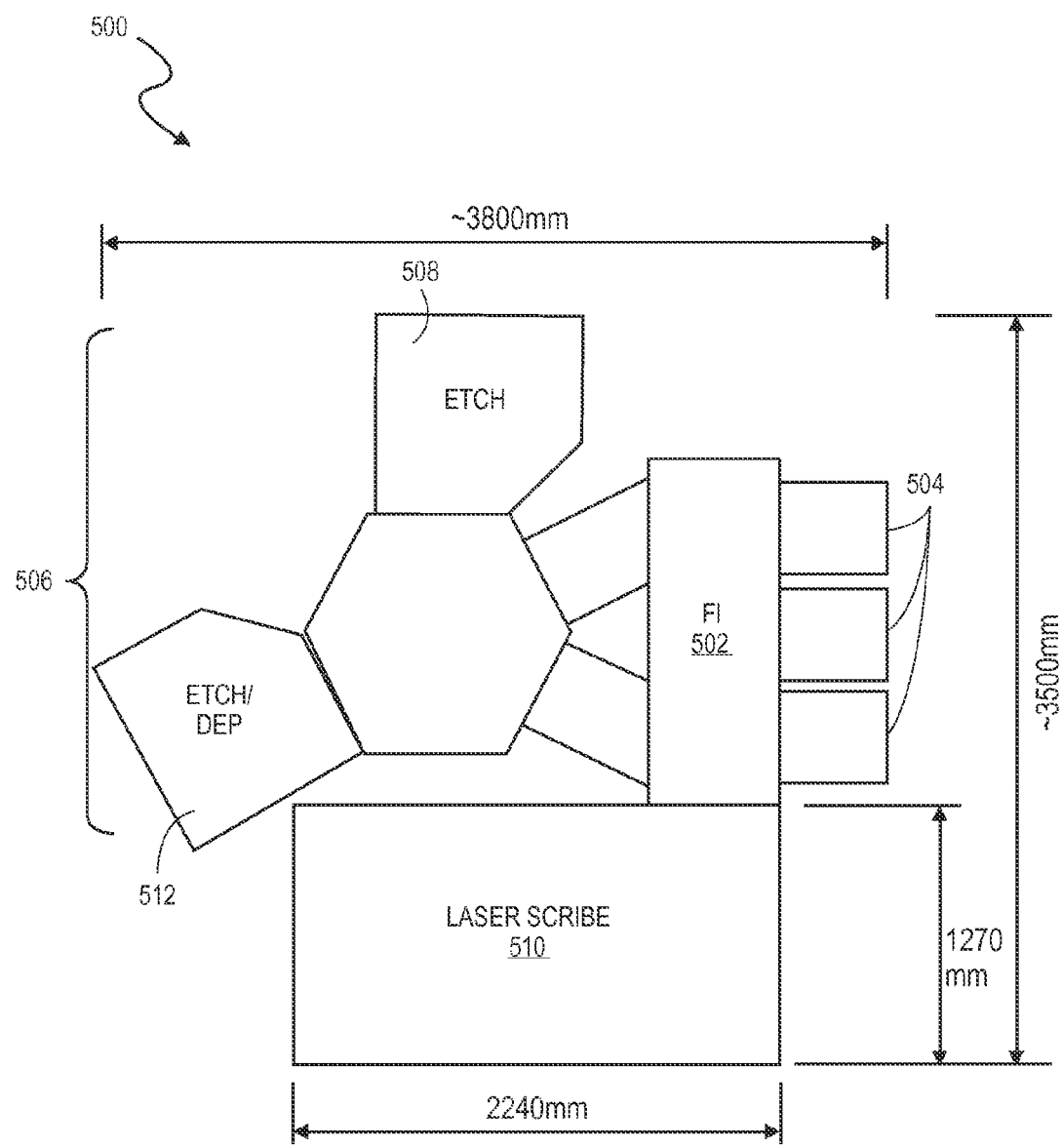
FIG. 5 illustrates a block diagram of a tool layout for laser and plasma dicing of wafers or substrates, in accordance with embodiments of the present invention.

Referring to FIG. 5, a process tool 500 includes a factory interface 502 (FI) having a plurality of load locks 504 coupled therewith. A cluster tool 506 is coupled with the factory interface 502. The cluster tool 506 includes a plasma etch chamber 508. A laser scribe apparatus 510 is also coupled to the factory interface 502. The overall footprint of the process tool 500 may be, in one embodiment, approximately 3500 millimeters (3.5 meters) by approximately 3800 millimeters (3.8 meters), as depicted in FIG. 5.

In an embodiment, the laser scribe apparatus 510 houses a laser. In one such embodiment, the laser is a femtosecond-based laser. The laser is suitable for performing a laser ablation portion of a hybrid laser and etch singulation process including the use of a mask, such as the laser ablation processes described above. In one embodiment, a moveable stage is also included in process tool 500, the moveable stage configured for moving a wafer or substrate (or a carrier thereof) relative to the laser. In a specific embodiment, the laser is also moveable. The overall footprint of the laser scribe apparatus 510 may be, in one embodiment, approximately 2240 millimeters by approximately 1270 millimeters, as depicted in FIG. 5.

In an embodiment, the plasma etch chamber 508 is configured for etching a wafer or substrate through the gaps in a patterned mask to singulate a plurality of integrated circuits. In one such embodiment, the plasma etch chamber 508 is configured to perform a deep silicon etch process. In a specific embodiment, the plasma etch chamber 508 is an Applied Centura® Silvia™ Etch system, available from Applied Materials of Sunnyvale, Calif., USA. The plasma etch chamber 508 may be specifically designed for a deep silicon etch used to create singulate integrated circuits housed on or in single crystalline silicon substrates or wafers. In an embodiment, a high-density plasma source is included in the plasma etch chamber 508 to facilitate high silicon etch rates. In an embodiment, more than one plasma etch chamber is included in the cluster tool 506 portion of process tool 500 to enable high manufacturing throughput of the singulation or dicing process.

In an embodiment, the plasma etch chamber 508 includes a chuck disposed with the chamber to clamp a wafer while disposed on a tape frame during a plasma process. The factory interface 502 may be a suitable atmospheric port to interface between an outside manufacturing facility with laser scribe apparatus 510 and cluster tool 506. The factory interface 502 may include robots with arms or blades for transferring wafers (or carriers thereof) from storage units (such as front opening unified pods) into either cluster tool 506 or laser scribe apparatus 510, or both.

Cluster tool 506 may include other chambers suitable for performing functions in a method of singulation. For example, in one embodiment, in place of an additional etch chamber, a deposition chamber 512 is included. The deposition chamber 512 may be configured for mask deposition on or above a device layer of a wafer or substrate prior to laser scribing of the wafer or substrate. In one such embodiment, the deposition chamber 512 is suitable for depositing a photoresist layer.

Embodiments further include a plasma etch chamber with a chamber shield ring configured to cover a tape film frame. FIG. 6 illustrates a schematic of an etch chamber including a chamber shield ring, in accordance with an embodiment.

FIG. 6 illustrates a cross-sectional schematic view of a plasma processing system 600 which includes a component for which temperature is controlled. In one embodiment, the plasma processing system 600 is employed as the etch chamber 508 in the platform 500. The plasma processing system 600 may be any type of processing chamber known in the art, including plasma etch chambers, such as, but not limited to, the Applied Centura® Silvia™ Etch system manufactured by Applied Materials of CA, USA.

The plasma processing system 600 includes a grounded chamber 605. A workpiece to be processed (e.g., a substrate) 400 (illustrated in FIG. 6 in positions 400A and 400B) is loaded through an opening 615 in position 400B and disposed in a down position (400A) to the temperature controlled chuck 408A. The dimension of the substrate may vary as known in the industry with conventional silicon substrates currently having a diameter of 300 mm and 450 mm. In particular embodiments, the temperature controlled chuck 408A includes a plurality of zones, each zone independently controllable (e.g., by the chiller 677 and/or temperature controller 675 and/or controller 670) to a temperature setpoint which may be the same or different between the zones. For example, the temperature controlled chuck 408A may include both an inner thermal zone proximate a center of substrate 400 and an outer thermal zone proximate to a periphery/edge of substrate 400. The film frame 408 attached to the substrate 400 is also disposed on the chuck 408A. The controller 670 may be one of any form of general-purpose data processing system that can be used in an industrial setting for controlling the various subprocessors and subcontrollers. Generally, the controller 670 includes a central processing unit (CPU) 672 in communication with memory 673 and input/output (I/O) circuitry 674, among other common components. Software commands executed by CPU 672, cause system 600 to, for example, load the substrate 400 into the plasma etch chamber 605, introduce process gas(es) from the sources 645, and energize them into a plasma through delivery of RF energy from one or more of the RF sources 625, 626, and 630. Portions of the present invention may be provided as a computer program product, which may include a computer-readable medium having stored thereon instructions, which may be used to program a computer (or other electronic devices) to control the etch system 600 to perform the etch method 100 of FIG. 1. The computer-readable medium may include, but is not limited to, floppy diskettes, optical disks, CD-ROMs (compact disk read-only memory), and magneto-optical disks, ROMs (read-only memory), RAMs (random access memory), EPROMs (erasable programmable read-only memory), EEPROMs (electrically-erasable programmable read-only memory), magnet or optical cards, flash memory, or other commonly known type computer-readable storage medium suitable for storing electronic instructions. Moreover, the present invention may also be downloaded as a program file containing a computer program product, wherein the program file may be transferred from a remote computer to a requesting computer.

The etch system 600 further includes the chamber shield ring 450 (illustrated in FIG. 6 in positions 450A and 450B) which is movable from an elevated position 450B (drawn in dashed line) and a lowered position 450A, where the ring 450 shields the frame 408 during plasma processing without covering any portion of the substrate 400. The chamber shield ring 450 depicted in FIG. 6 may have one, some, or all of the characteristics described elsewhere in the context of FIG. 4D.

Process gases, are supplied from a gas source 645 through a mass flow controller 649 to the interior of the chamber 605. The chamber 605 is evacuated via an exhaust valve 651 connected to a high capacity vacuum pump stack 655.

When plasma power is applied to the chamber 605, a plasma is formed in a processing region over the substrate 400. A first plasma bias power 625 is coupled to the chuck 408A (e.g., cathode) via transmission line 628 to energize the plasma. The plasma bias power 625 typically has a low frequency between about 2 MHz to 60 MHz, and in a particular embodiment, is in the 13.56 MHz band. In the exemplary embodiment, the plasma processing system 600 includes a second plasma bias power 626 operating at about the 2 MHz band which is connected to the same RF match 627 as the plasma bias power 625 to provide a dual frequency bias power. In one dual frequency bias power embodiment for the exemplary 300 mm substrate, a 13.56 MHz generator supplies between 500 W and 10,000 W while a 2 MHz generator supplies between 0 and 10,000 W of power for a total bias power ($W_{b,tot}$) of between 500 W and 2,0000 W. In another dual frequency bias power embodiment a 60 MHz generator supplies between 100 W and 8,000 W while a 2 MHz generator supplies between 0 and 10,000 W of power for a total bias power ($W_{b,tot}$) of between 100 W and 20,000 W.

A plasma source power 630 is coupled through a match (not depicted) to a plasma generating element 635 (e.g., a showerhead) which may be anodic relative to the chuck 408A to provide high frequency source power to energize the plasma. The plasma source power 630 typically has a higher frequency than the plasma bias power 625, such as between 100 and 180 MHz, and in a particular embodiment, is in the 162 MHz band. In particular embodiments, the top source operates between 100 W and 5,000 W. Bias power more directly affects the bias voltage on the substrate 400, controlling ion bombardment of the substrate 400, while source power more directly affects the plasma density.

It is noted that these exemplary power ranges are for processing of a workpiece having a 300 mm diameter (e.g., 12 inch wafer) and power levels can be expected to scale with subsequent generations of the systems so as to maintain at least the same power densities (i.e., watts/unit of substrate area). For example, in an embodiment where the system 600 is configured for 450 mm substrates, the power ranges above are increased by a factor of between 2 and 2.5.

It is to be understood that the above description is intended to be illustrative, and not restrictive. For example, while flow diagrams in the figures show a particular order of operations performed by certain embodiments of the invention, it should be understood that such order is not required (e.g., alternative embodiments may perform the operations in a different order, combine certain operations, overlap certain operations, etc.). Furthermore, many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

What is claimed is:

1. A method of dicing a semiconductor wafer comprising a plurality of integrated circuits, the method comprising:
coupling the semiconductor wafer to a film frame;
forming a mask above the semiconductor wafer, the mask covering and protecting the integrated circuits;
disposing the semiconductor wafer over a temperature controlled chuck surface of a plasma chamber and disposing the film frame over a top surface of a temperature controlled annular ring disposed around the temperature controlled chuck surface;
covering the film frame with a chamber shield ring without covering any portion of the semiconductor wafer with the chamber shield ring, wherein the chamber shield ring has an outer diameter greater than that of the film frame; and
plasma etching the semiconductor wafer while the semiconductor wafer is coupled to the film frame.

2. The method of claim 1, further comprising:
cooling the temperature controlled chuck surface and the top surface of the temperature controlled annular ring.

3. The method of claim 2, wherein cooling the temperature controlled chuck surface and the top surface of the temperature controlled annular ring comprises cooling the chuck surface and the top surface of the annular ring to less than 0° C.

4. The method of claim 2, wherein cooling the temperature controlled chuck surface comprises supplying a gas through the temperature controlled chuck surface to a backside of the semiconductor wafer while plasma etching the semiconductor wafer.

5. The method of claim 4, wherein supplying the gas through the temperature controlled chuck surface comprises providing a flow rate sufficient to maintain a backside pressure no greater than 3 mT.

6. The method of claim 1, further comprising, prior to the plasma etching:
patterning the mask with a laser scribing process to provide a patterned mask with gaps, exposing regions of the semiconductor wafer between the integrated circuits; and
transferring the semiconductor wafer coupled to the film frame to a plasma etch chamber;
wherein plasma etching the semiconductor wafer comprises plasma etching the semiconductor wafer through the gaps in the patterned mask to form singulated integrated circuits while the semiconductor wafer is coupled to the film frame.

7. The method of claim 1, wherein the shield ring is affixed to the plasma etch chamber by a set of lifter pins configured to raise and lower the shield ring between an elevated position and a lowered position.

8. The method of claim 1, wherein the chamber shield ring is separated from a top surface of the film frame by a gap of 1 to 5 mm.

9. A method of dicing a semiconductor wafer comprising a plurality of integrated circuits, the method comprising:
coupling the semiconductor wafer to a film frame, wherein a mask is disposed over the semiconductor wafer;
disposing the semiconductor wafer over a temperature controlled chuck surface of a plasma chamber and disposing the film frame over a top surface of a temperature controlled annular ring disposed around the temperature controlled chuck surface;
covering the film frame with a chamber shield ring without covering any portion of the semiconductor wafer with the chamber shield ring, wherein the chamber shield ring has an outer diameter greater than that of the film frame; and
plasma etching the semiconductor wafer while the semiconductor wafer is coupled to the film frame.

10. The method of claim 9, further comprising:
cooling the temperature controlled chuck surface and the top surface of the temperature controlled annular ring.

11. The method of claim 10, wherein cooling the temperature controlled chuck surface and the top surface of the temperature controlled annular ring comprises cooling the chuck surface and the top surface of the annular ring to less than 0° C.

12. The method of claim 10, wherein cooling the temperature controlled chuck surface comprises supplying a gas through the temperature controlled chuck surface to a backside of the semiconductor wafer while plasma etching the semiconductor wafer.

13. The method of claim 12, wherein supplying the gas through the temperature controlled chuck surface comprises providing a flow rate sufficient to maintain a backside pressure no greater than 3 mT.

14. The method of claim 9, further comprising, prior to the plasma etching:
patterning the mask with a laser scribing process to provide a patterned mask with gaps, exposing regions of the semiconductor wafer between the integrated circuits; and
transferring the semiconductor wafer coupled to the film frame to a plasma etch chamber;
wherein plasma etching the semiconductor wafer comprises plasma etching the semiconductor wafer through the gaps in the patterned mask to form singulated integrated circuits while the semiconductor wafer is coupled to the film frame.

* * * * *